United States Patent
Noda et al.

(10) Patent No.: US 8,300,672 B2
(45) Date of Patent: Oct. 30, 2012

(54) TWO-DIMENSIONAL PHOTONIC CRYSTAL LASER

(75) Inventors: Susumu Noda, Kyoto (JP); Seita Iwahashi, Kyoto (JP); Yoshitaka Kurosaka, Hamamatsu (JP); Kyosuke Sakai, Sapporo (JP); Eiji Miyai, Kyoto (JP); Dai Ohnishi, Otsu (JP); Wataru Kunishi, Kyoto (JP)

(73) Assignee: Japan Science and Technology Agency, Kawaguchi (JP)

( * ) Notice: Subject to any disclaimer, the term of this patent is extended or adjusted under 35 U.S.C. 154(b) by 0 days.

(21) Appl. No.: 13/061,337

(22) PCT Filed: Aug. 18, 2009

(86) PCT No.: PCT/JP2009/003924
§ 371 (c)(1),
(2), (4) Date: Apr. 5, 2011

(87) PCT Pub. No.: WO2010/023842
PCT Pub. Date: Mar. 4, 2010

(65) Prior Publication Data
US 2011/0188526 A1 Aug. 4, 2011

(30) Foreign Application Priority Data
Aug. 29, 2008 (JP) .................................. 2008-222384

(51) Int. Cl.
*H01S 5/00* (2006.01)
(52) U.S. Cl. ............. 372/50.124; 372/43.01; 372/50.11; 372/102
(58) Field of Classification Search ............... 372/50.124
See application file for complete search history.

(56) References Cited

U.S. PATENT DOCUMENTS
2004/0247009 A1* 12/2004 Noda et al. ................. 372/99
(Continued)

FOREIGN PATENT DOCUMENTS
CA 2 451 565 A1 1/2003
(Continued)

OTHER PUBLICATIONS
International Search Report mailed Sep. 15, 2009 issued in International Patent Application No. PCT/JP2009/003924 (with translation).
(Continued)

*Primary Examiner* — Patrick Stafford
*Assistant Examiner* — Xinning Niu
(74) *Attorney, Agent, or Firm* — Oliff & Berridge, PLC

(57) ABSTRACT

A two-dimensional photonic crystal laser light is provided. The two-dimensional photonic crystal laser includes a two-dimensional photonic crystal made of a plate-shaped member provided with a periodic arrangement of identically-shaped modified refractive index areas having a refractive index different from that of the plate-shaped member; and an active layer provided on one side of the two-dimensional photonic crystal. The modified refractive index areas are arranged at lattice points of a lattice with a same period at least in two directions; each modified refractive index area is shaped so that a feedback strength is different with respect to directions of two primitive lattice vectors of the lattice; the two-dimensional photonic crystal has a periodic structure of a supercell, which contains a plurality of lattice points; and the sum of the feedback strengths by all modified refractive index areas in the supercell is identical in each direction of the two primitive lattice vectors.

10 Claims, 5 Drawing Sheets

U.S. PATENT DOCUMENTS

| | | |
|---|---|---|
| 2007/0075318 A1 | 4/2007 | Noda et al. |
| 2009/0016395 A1 | 1/2009 | Noda et al. |
| 2009/0135869 A1 | 5/2009 | Noda et al. |

FOREIGN PATENT DOCUMENTS

| | | |
|---|---|---|
| CA | 2 521 005 A1 | 10/2004 |
| CA | 2 558 225 A1 | 9/2005 |
| CN | 1547792 A | 11/2004 |
| CN | 1765034 A | 4/2006 |
| CN | 1926730 A | 3/2007 |
| EP | 1 411 603 A1 | 4/2004 |
| EP | 1 610 427 A1 | 12/2005 |
| EP | 1 724 887 A1 | 11/2006 |
| EP | 1 933 431 A1 | 6/2008 |
| JP | A-2003-23193 | 1/2003 |
| JP | A-2003-332351 | 11/2003 |
| JP | A-2004-296538 | 10/2004 |
| JP | A-2007-180120 | 7/2007 |
| JP | 2007-273730 | 10/2007 |
| KR | 10-2005-0111362 A | 11/2005 |
| KR | 10-2007-0006826 | 1/2007 |
| KR | 10-2008-0049734 | 6/2008 |
| WO | WO 03/005513 A1 | 1/2003 |
| WO | WO 2004/086575 A1 | 10/2004 |
| WO | WO 2005/086302 A1 | 9/2005 |
| WO | WO 2007/029661 A1 | 3/2007 |

OTHER PUBLICATIONS

International Preliminary Report on Patentability issued Apr. 12, 2011 in International Patent Application No. PCT/JP2009/003924 (with translation).

\* cited by examiner

SQUARE LATTICE

TRIANGULAR LATTICE

ORTHORHOMBIC LATTICE ($|\vec{b_1}|=|\vec{b_2}|$)

TWO-DIMENSIONAL PHOTONIC CRYSTAL LASER

TECHNICAL FIELD

The present invention relates to a two-dimensional photonic crystal laser which emits laser light in a direction perpendicular to an active layer.

BACKGROUND ART

In recent years, new types of lasers using a photonic crystal have been developed. A photonic crystal consists of a dielectric body material in which an artificial periodic structure is created. Usually, the periodic structure is created by providing the body material with a periodic arrangement of areas whose refractive index differs from that of the body material (this area is hereinafter called the "modified refractive index area"). The periodic structure causes a Bragg diffraction within the crystal and creates an energy band gap for the energy of light. There are two types of photonic crystal lasers: one utilizes a band-gap effect to make a point-like defect function as a resonator, and the other utilizes a standing wave at a band edge where the group velocity of light becomes zero. Each of these devices causes a laser oscillation by amplifying light of a predetermined wavelength.

Patent Document 1 discloses a two-dimensional photonic crystal laser in which a two-dimensional photonic crystal is created in the vicinity of an active layer containing a luminescent material. The two-dimensional photonic crystal includes a plate-shaped member in which circular holes (i.e. modified refractive index areas) are periodically arranged (e.g. in a triangular or square lattice pattern) so as to provide the crystal with a two-dimensional, periodic distribution of refractive index. Its period is adjusted so that it equals the wavelength of light to be generated within the active layer by an injection of carriers from an electrode. As a result, a two-dimensional standing wave is produced within the two-dimensional photonic crystal, whereby the light is strengthened to produce a laser oscillation. The laser light is diffracted by the circular holes to a direction perpendicular to the active layer and two-dimensional photonic crystal, and emitted in this direction.

In the case where circular holes are used as described in Patent Document 1, the electric field of light in the two-dimensional photonic crystal encircles the (gravity) center of each circular hole and is anti-symmetrical with respect to the gravity center. The anti-symmetry of the electric field cancels the electric field at every hole due to interference (or destructive interference). If the two-dimensional photonic crystal has an infinite extent, the electric field will be completely cancelled due to such a destructive interference, so that the laser light cannot be extracted perpendicularly to the two-dimensional photonic crystal. Actually, the extent of the two-dimensional photonic crystal is finite. Therefore, the electric field cannot be completely cancelled, so that the laser light will be extracted. However, the strength of the laser light will not be sufficient due to the influence of the destructive interference.

Patent Document 2 discloses a two-dimensional photonic crystal laser which utilizes modified refractive index areas having a characteristic shape in order to prevent the destructive interference. In each modified refractive index area, no part of the modified refractive index area lies on a first half-line extending from the gravity center thereof in a direction within a plane of the two-dimensional photonic crystal, while at least a part of the modified refractive index area lies on a second half-line extending from the gravity center in a direction opposite to the first half-line. As an example of the modified refractive index area having such a shape, Patent Document 2 discloses a V-shaped modified refractive index area 91A (FIG. 1A) and a cluster modified refractive index area 91B (FIG. 1B) having an equilateral-triangular arrangement of three identically-shaped modified refractive index areas as a unit. Both in the V-shaped modified refractive index area 91A and in the cluster modified refractive index area 91B, no modified refractive index area lies on the first half-line 921 extending from the gravity center G in one direction, whereas a modified refractive index area lies on the second half-line 922 extending in the direction opposite to the first half-line 921.

Using a modified refractive index area having such a shape results in a difference in the refractive index between the first half-line side and the second half-line side. This suppresses the destructive interference, so that the laser light can be emitted with a greater strength than in the case of using a circular modified refractive index area.

BACKGROUND ART DOCUMENT

Patent Documents

[Patent Document 1] JP-A 2003-332351 (Paragraphs [0037] to [0056], and FIG. 1)
[Patent Document 2] JP-A 2007-273730 (Paragraphs [0009] to [0011], [0014] to [0016], and [0022] to [0024], and FIG. 4)

DISCLOSURE OF THE INVENTION

Problem to be Solved by the Invention

In the invention of Patent Document 2, the V-shaped modified refractive index areas 91A are arranged in a square lattice pattern in a plate-shaped member 93 with a predetermined period (period a) in one direction (x-direction) which is parallel to the two-dimensional photonic crystal and with period a in y-direction which is parallel to the two-dimensional photonic crystal and perpendicular to the x-direction. Each of the modified refractive index areas 91A is arranged in such a manner that the shape of V points in a direction parallel to the x-direction (or y-direction) (FIG. 2A). Within this two-dimensional photonic crystal, a standing wave with wavelength a is produced in both x and y directions. Since the modified refractive index area 91A is asymmetrical with respect to an axis 94 at 45 degrees to both x and y directions (FIG. 1A), the distribution of refractive index in the x-direction and that in the y-direction are different. Hence, the standing wave created in the two-dimensional photonic crystal has different amplitudes in the x and y directions. This results in an asymmetrical pattern of the spot of laser light emitted from the two-dimensional photonic crystal. Although such an asymmetry may be useful depending on the usage of the laser light, it can be disadvantageous when a symmetrical spot is required. This problem also arises in the cluster modified refractive index areas 91B.

The problem to be solved by the present invention is to provide a two-dimensional photonic crystal laser for producing a symmetrical spot of laser light.

Means for Solving the Problem

To solve the aforementioned problem, the present invention provides a two-dimensional photonic crystal laser, including:

a two-dimensional photonic crystal made of a plate-shaped member provided with a periodic arrangement of many identically-shaped modified refractive index areas having a refractive index different from that of the plate-shaped member; and an active layer provided on one side of the two-dimensional photonic crystal, wherein:

the modified refractive index areas are arranged at lattice points of a lattice with a same period at least in two directions;

a shape of each modified refractive index area is such that a feedback strength is different with respect to directions of two primitive reciprocal lattice vectors of the lattice;

the two-dimensional photonic crystal has a periodic structure of a supercell, as a unit, which contains a plurality of lattice points; and a sum of the feedback strength by all modified refractive index areas in the supercell is identical in each direction of the two primitive reciprocal lattice vectors.

In the present application, a "supercell" refers to an area containing two or more lattice points within a two-dimensional photonic crystal, and characterized in that, by translating this area, the lattice points and the shape of the modified refractive index areas of a supercell can be made to perfectly overlap those of another supercell.

If modified refractive index areas are provided at the lattice points as previously described, the light propagating in the directions of two primitive reciprocal lattice vectors of the lattice (in the direction perpendicular to the arrangement of the lattice points) causes a second-order Bragg diffraction. Therefore, only a wavelength corresponding to the period of the arrangement of the lattice points is selected due to interference, producing a standing wave at this wavelength. This phenomenon is called a feedback effect. At this point, a feedback strength $\kappa_f$ is introduced as the index for the magnitude of the feedback effect (i.e. the degree of symmetry) for each direction of the primitive reciprocal lattice vectors (i.e. the direction in which a standing wave is produced). The feedback strength $\kappa_f$ is defined by the following formula:

$$\kappa_f = \frac{1}{S}\int_S \varepsilon(\vec{r})\exp(-j\vec{G}_2 \cdot \vec{r})d\vec{r}, \quad (1)$$

where, S represents the area of a unit lattice, $\in(r)$ represents the permittivity distribution in the unit lattice, $G_2$ represents the reciprocal lattice vector representing a second-order Bragg diffraction, j represents an imaginary unit, and the integral sign $\int_S$ signifies performing an area integration within the unit lattice. The reciprocal lattice vector $G_2$ corresponds to the double of either one of the two primitive reciprocal lattice vectors. (In the case of a triangular lattice, in addition to the two primitive reciprocal lattice vectors, the sum or the difference of these two primitive reciprocal lattice vectors also corresponds to the reciprocal lattice vector $G_2$, as will be described later.) Therefore, based on formula (1), the feedback strength $\kappa_f$ can be obtained for two directions (or three directions in the case of a triangular lattice). The permittivity distribution $\in(r)$ in the unit lattice depends on the shape of the modified refractive index area. Therefore, it is understood from formula (1) that the feedback strength $\kappa_f$ in the two (or three) directions can take different values depending on the shape.

In the present invention, in the case where the component values of the feedback strength $\kappa_f$ in the two (or three) directions are different, the modified refractive index areas are arranged in such a manner that the sum of the feedback strengths by all the modified refractive index areas in a supercell will be the same in these directions, thereby the standing waves having the same strength in these two (or three) directions are produced. Consequently, symmetrical spots of laser light can be obtained.

The lattice may be any one of a square lattice, a triangular lattice, and an orthorhombic lattice in which the two primitive reciprocal lattice vectors have the same magnitude. FIG. 3 shows plain views illustrating (real-space) primitive lattice vectors $a_1$ and $a_2$ with the solid line arrows and primitive reciprocal lattice vectors $b_1$ and $b_2$ with the dashed line arrows: FIG. 3A is for a square lattice (where the lattice constant is $a_1$ and the angle $\gamma$ formed by the primitive vectors $a_1$ and $a_2$ is 90°); FIG. 3B is for a triangular lattice (where the lattice constant is a, and $\gamma$=120°); and FIG. 3C is for an orthorhombic lattice (where the lattice constant is a, and $\gamma\neq 90°$, 120°) in which the two primitive reciprocal lattice vectors have the same magnitude. For the triangular lattice, vectors $(a_1+a_2)$ and $(b_2-b_1)$ are additionally shown. Each of the primitive reciprocal lattice vectors $b_1$ and $b_2$ (and $(b_2-b_1)$ for the case of the triangular lattice) is perpendicular to one of the primitive lattice vectors $a_1$ and $a_2$ (and $(a_1+a_2)$ for the case of the triangular lattice), and a standing wave is produced in the directions of the vectors $b_1$ and $b_2$ (and $(b_2-b_1)$). The wavelength of the standing wave is a in FIG. 3A the square lattice, $(3^{0.5}/2)a$ in FIG. 3B the triangular lattice, and $a \times \sin\gamma$ in FIG. 3C the orthorhombic lattice. In the triangular lattice, the primitive lattice vectors can be defined with $\gamma$=60°. In this case, the primitive reciprocal lattice vectors will be $b_1$, $b_2$, and $b_1+b_2$.

In the case of the square lattice, the two primitive reciprocal lattice vectors point in the same directions as the primitive lattice vectors of the same square lattice. These two directions will be hereinafter referred to as the x-direction and y-direction. Based on formula (1), the feedback strengths $\kappa_{fx}$ and $\kappa_{fy}$ in the x-direction and y-direction are expressed as follows:

$$\kappa_{fx} = \frac{1}{S}\int_S \varepsilon(x, y)\exp(-2jx)dxdy \quad (2)$$

$$\kappa_{fy} = \frac{1}{S}\int_S \varepsilon(x, y)\exp(-2jy)dxdy. \quad (3)$$

In formulae (2) and (3), the values of $\kappa_{fx}$ and $\kappa_{fy}$ become identical when x and y are interchanged, excluding $\in(x, y)$. That is, the values of $\kappa_{fx}$ and $\kappa_{fy}$ are the same in the case where the value of $\in(x, y)$ remains the same even if x and y are interchanged, i.e. in the case where the modified refractive index area is symmetrical with respect to an axis at 45° to both x and y directions. Since formulae (2) and (3) can be used for both the right-handed coordinate system and the left-handed coordinate system, the values of $\kappa_{fx}$ and $\kappa_{fy}$ are the same also in the case where the modified refractive index area is symmetrical with respect to an axis at 90° to the aforementioned axis. However, the values of $\kappa_{fx}$ and $\kappa_{fy}$ are not the same if the modified refractive index area is asymmetrical with respect to both of these axes. In this case, if many modified refractive index areas are oriented in the same direction, the spots of laser light become less symmetrical. In the present invention, the modified refractive index areas are arranged in such a manner that the sum of the feedback strengths by all the modified refractive index areas within a supercell are the same in the x-direction and y-direction, thereby producing standing waves having the same strength in these two directions. Consequently, symmetrical spots of laser light are obtained.

In the case where a square lattice is used, each of the supercells may be composed of four lattice points as a unit, with two lattice points in a vertical direction and two lattice points in a horizontal direction. In this case, the directions of the modified refractive index areas in the supercell may be as follows: (1) with respect to the direction of one modified refractive index area in the supercell, the directions of other three modified refractive index areas are at 90°, 80°, and 270°; or (2) with respect to the direction of one modified refractive index area in the supercell, the direction of one modified refractive index area among the other three modified refractive index areas is the same and the directions of the remaining two modified refractive index areas are at 90°.

In the case of a triangular lattice, the feedback strengths and standing waves are produced in the three directions indicated by the primitive reciprocal lattice vectors $b_1$ and $b_2$ as well as the difference of these primitive reciprocal lattice vectors $(b_2-b_1)$ (or that of the sum $(b_1+b_2)$). In this case, if the term $\in(x, y)$ of formula (1) has a threefold rotational symmetry, the feedback strengths in these three directions will be the same. To this end, the modified refractive index areas in the supercell may be oriented so that the directions of two modified refractive index areas are at 120° and 240°, respectively, to the direction of one modified refractive index area.

Effects of the Invention

With the two-dimensional photonic crystal laser according to the present invention, the feedback strengths are the same in two (or three) directions independently of the shape of the modified refractive area. Thereby, laser light with symmetrical spots can be obtained.

BRIEF DESCRIPTION OF THE DRAWINGS

FIG. 3A is for a square lattice; FIG. 3B is for a triangular lattice; and FIG. 3C is for an orthorhombic lattice in which two primitive reciprocal lattice vectors have the same magnitude.

BEST MODES FOR CARRYING OUT THE INVENTION

Embodiments of the two-dimensional photonic crystal laser according to the present invention will be described with reference to FIGS. 4 through 9.

Figure 4:
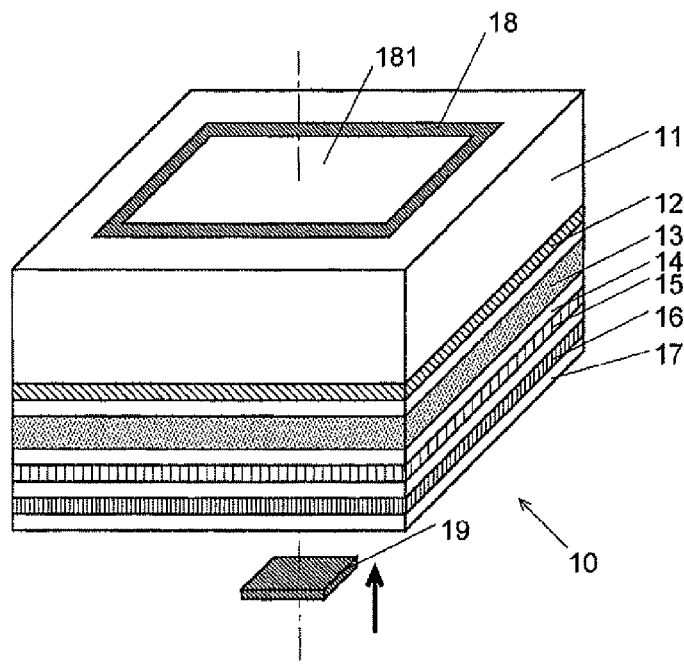
FIG. 4 is a perspective view showing an embodiment of the two-dimensional photonic crystal laser according to the present invention.

FIG. 4 is a perspective view of the two-dimensional photonic crystal laser 10 of the present embodiment. This laser 10 includes an upper substrate 11, under which an active layer 13 is located, with a first cladding layer 12 in between. Under the active layer 13 is a two-dimensional photonic crystal 15, with a spacer layer 14 in between. The structure of the two-dimensional photonic crystal 15 will be described later. Under the two-dimensional photonic crystal 15 is a lower substrate 17, with a second cladding layer 16 in between. An upper electrode 18 is provided on the upper substrate 11, and a lower electrode 19 beneath the lower substrate 17. The upper electrode 18 has a window 181 for allowing the passage of laser light at the center of a plate-shaped square metal.

In the present embodiment, an n-type semiconductor of gallium arsenide (GaAs) is used for the upper substrate 11, an n-type semiconductor of aluminum gallium arsenide (AlGaAs) for the first cladding layer 12, p-GaAs for the spacer layer 14, p-AlGaAs for the second cladding layer 16, and p-GaAs for the lower substrate 17. The active layer 13 has multiple-quantum wells (MQW) made of indium gallium arsenide (InGaAs)/gallium arsenide (GaAs). The materials of these layers are not limited to the aforementioned ones, and those used for each layer in a conventional two-dimensional photonic crystal laser can be used without modification.

Figure 1A:
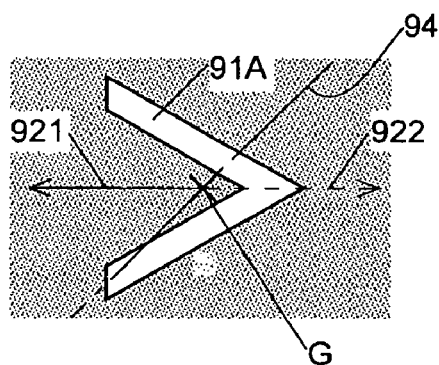
FIG. 1A and FIG. 1B are top views showing examples of a modified refractive index area used in a conventional two-dimensional photonic crystal laser and the two-dimensional photonic crystal laser of the present invention.
Figure 1B:
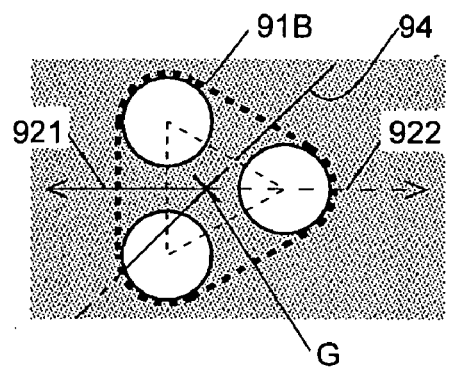
Figure 2A:
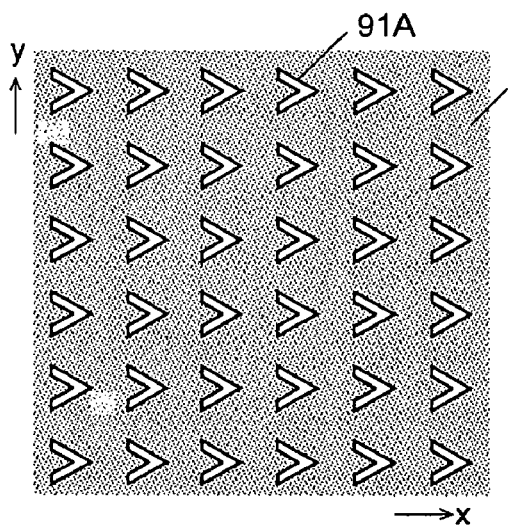
FIG. 2A.
Figure 2B:
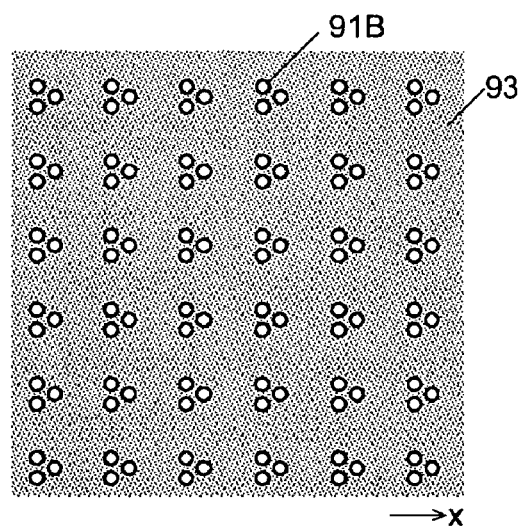
FIG. 2B are top views showing examples of a two-dimensional photonic crystal used in a conventional two-dimensional photonic crystal laser.
Figure 3A:
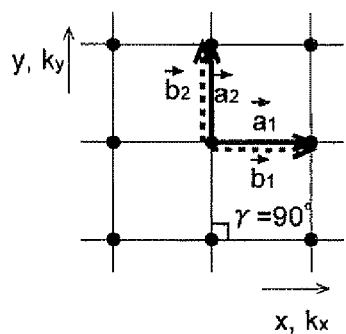
FIG. 3A, FIG. 3B and FIG. 3C show plain views illustrating (real-space) primitive lattice vectors and primitive reciprocal lattice vectors.
Figure 3B:
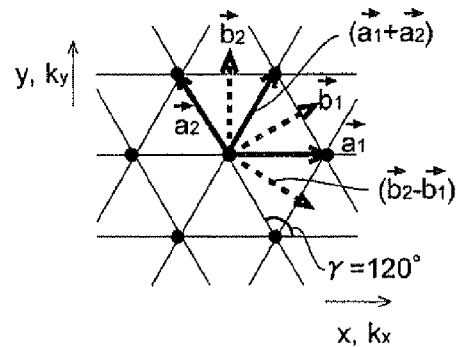
Figure 3C:
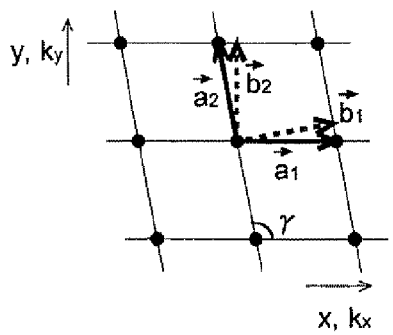
Figure 5:
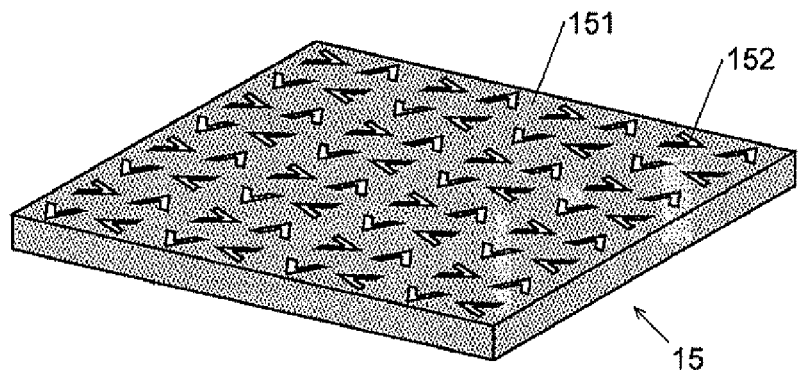
FIG. 5 is a perspective view of the two-dimensional photonic crystal 15 in the two-dimensional photonic crystal laser 10 of the present embodiment.
Figure 6:
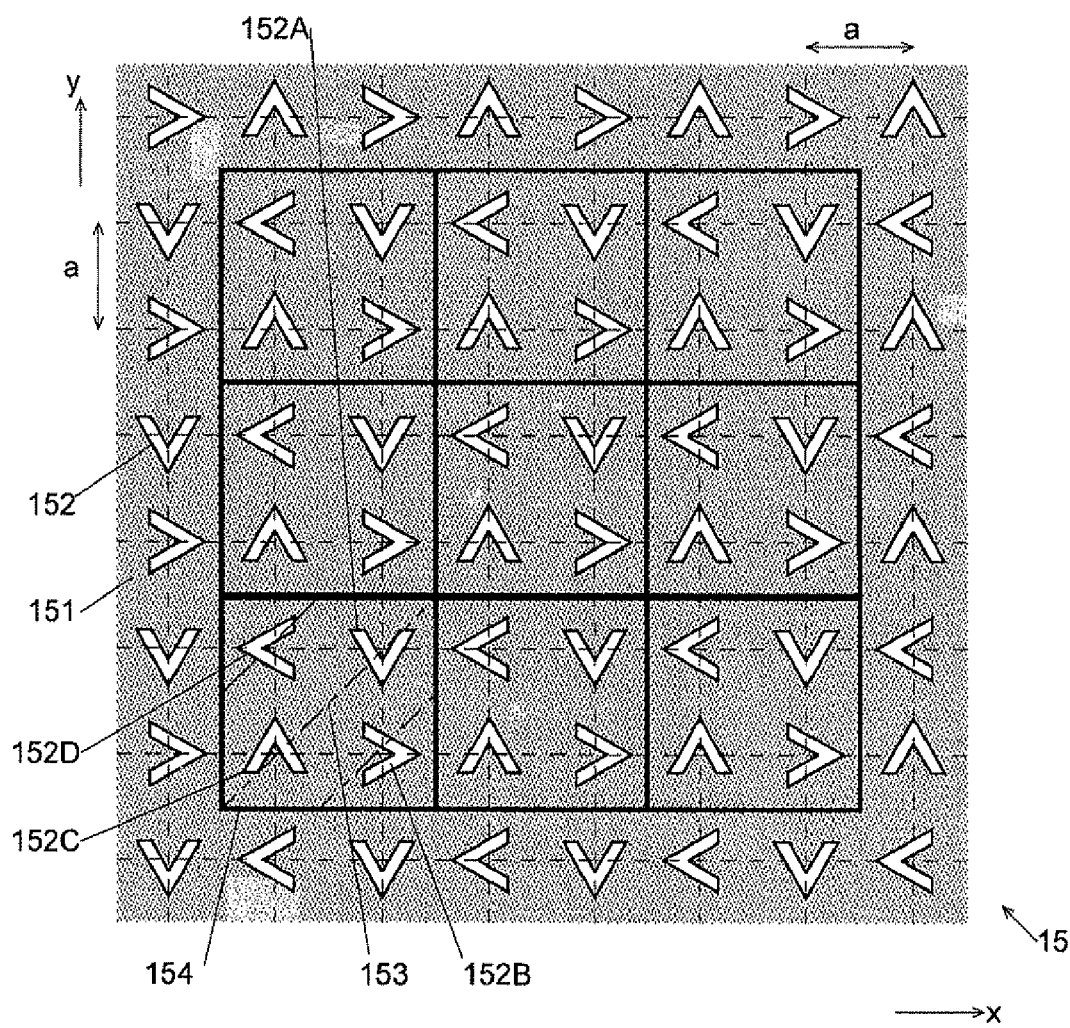
FIG. 6 is a top view of the two-dimensional photonic crystal 15.

In the two-dimensional photonic crystal 15, as shown in the perspective view of FIG. 5 and the top view of FIG. 6, air holes (or modified refractive index areas) 152 are arranged in a square lattice pattern (as indicated with thin dashed lines in FIG. 6) in the plate-shaped member 151 with a period a in both x and y directions. In the present embodiment, p-GaAs is used for the plate-shaped member 151. The holes 152 have the same shape as the V-shaped modified refractive index areas (FIG. 1A) described in Patent Document 2. The V-shape of the first V-shaped hole 152A, which is one of the V-shaped holes 152, points in a direction parallel to the y-direction (FIG. 6). With respect to the direction of the first V-shaped hole 152A, the second V-shaped hole 15213, which is adjacent to the first V-shaped hole 152A in the y-direction, is oriented at 90°; the third V-shaped hole 1520, which is next-adjacent to the first V-shaped hole 152A in the direction at 45° to both x and y directions, is oriented at 180°; and the fourth V-shaped hole 152D, which is adjacent to the first V-shaped hole 152A in the x-direction, is oriented at 270°. These first through fourth V-shaped holes 152A-152D form a supercell 154 as a unit, which is repeatedly arranged in the x-direction and y-direction. If the supercell 154 is moved (translated) in the x-direction by m holes and in the y-direction by n holes (where m and n are an integer), the first through fourth V-shaped holes 152A-152D completely overlap the V-shaped holes at that position. That is, the two-dimensional photonic crystal 15 has a periodic structure of the supercell 154 as a unit.

Each supercell 154 has two holes arranged in the x-direction and two holes in the y-direction. In the present application, such a supercell is referred to as a "2×2" supercell ((the number of holes in the x-direction in the supercell)×(the number of holes in the y-direction in the supercell)).

The operation of the two-dimensional photonic crystal laser 10 of the present embodiment will be described. When a voltage is applied between the upper electrode 18 and the lower electrode 19, electrons and positive holes are supplied to the active layer 13, where these electrons and positive holes are recombined, generating light within a specific wavelength band. This light is introduced into the two-dimensional photonic crystal 15 and propagated through the two-dimensional photonic crystal 15, being reflected by the V-shaped holes 152. In this process, the light at wavelength a in the wavelength band is amplified by interference (feedback effect). That is, since the period a of the V-shaped holes 152 in both x and y direction is the same as the wavelength, the reflected waves become in phase, so that a standing wave is produced in these two directions to cause the interference. As a result, the light having a wavelength a within the medium of the active layer 13 is produced. The produced laser light is diffracted by the V-shaped holes 152 to a direction perpendicular to the two-dimensional photonic crystal 15, and then emitted through the window 181 of the upper electrode 18 to the outside.

In the two-dimensional photonic crystal laser 10 of the present embodiment, each hole 152 is symmetrical with respect to an axis 153 at 45° to both x and y directions. Hence, in terms of only one hole 152, the values of $\kappa_{fx}$ and $\kappa_{fy}$ are different because the value of $\in(x, y)$ in formula (2) does not remain the same if x and y are interchanged. On the other hand, when the pair of the first V-shaped hole 152A and the fourth V-shaped hole 152D is considered, due to the fact that the directions in which they point are different by 90°, interchanging x and y of the term $\in(x, y)$ of the first V-shaped hole 152A makes the term $\in(x, y)$ of the fourth V-shaped hole 152D, while interchanging x and y of the term $\in(x, y)$ of the fourth V-shaped hole 152D makes the term $\in(x, y)$ of the first V-shaped hole 152A. The same relationship also holds between the second V-shaped hole 152B and the third V-shaped hole 152C. Given these factors, in terms of the supercell 154 as a unit, the sum of the values $\kappa_{fx}$ of the first through fourth V-shaped hole 152A-152D equals the sum of the values $\kappa_{fy}$ of the same four holes 152A-152D. That is, the feedback strengths in the x-directions and y-directions are the same, thereby symmetrical spots of laser light can be obtained in both x and y direction.

With reference to FIG. 7, a modified example of the two-dimensional photonic crystal 15 which can be used in the two-dimensional photonic crystal laser of the present embodiment will be described.

Figure 7A:
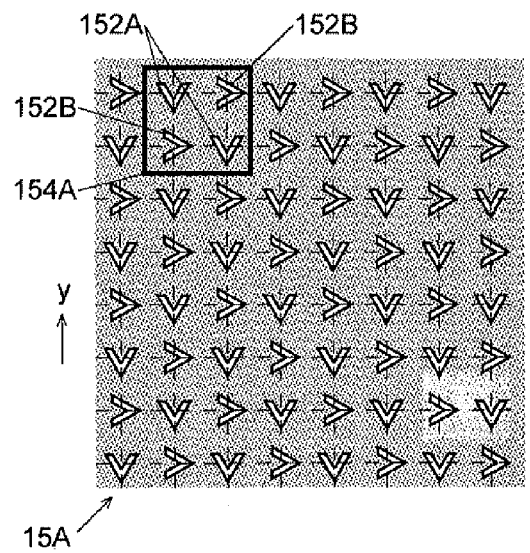
FIG. 7A and FIG. 7B are top views of a modification example of the two-dimensional photonic crystal in the two-dimensional photonic crystal laser of the present embodiment.

FIG. 7A shows a top view of the two-dimensional photonic crystal 15A as the first modification example. The two-dimensional photonic crystal 15A has a "2×2" supercell 154, in which two first V-shaped holes 152A are arranged along one diagonal while two V-shaped holes 152B are arranged along the other diagonal. Since the direction of the first V-shaped holes 152A and that of the second V-shaped holes 152B are 90° different from each other, the feedback strengths in the x-direction and y-direction are the same based on the same reason as explained for the aforementioned two-dimensional photonic crystal 15.

Figure 7B:
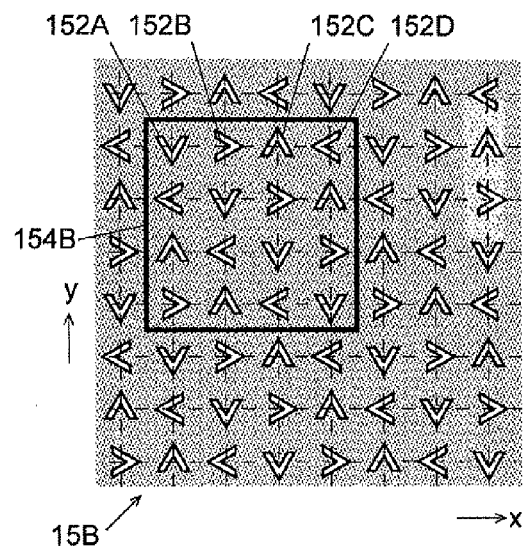

FIG. 7B shows a top view of the two-dimensional photonic crystal 15B as the second modification example. The two-dimensional photonic crystal 15B has a "4×4" supercell 154B. In the supercell 154B, four kinds of holes are arranged in the x-direction in the following order: the first V-shaped hole 152A, the second V-shaped hole 152B, the third V-shaped hole 152C, and the fourth V-shaped hole 152D. These four kinds of holes are also arranged in this order in the y-direction. In each supercell of the two-dimensional photonic crystal 15B, the number of the first V-shaped holes 152A and that of the fourth V-shaped holes 152D are the same, and the number of the second V-shaped holes 152B and that of the third V-shaped holes 152C are the same. Therefore, the feedback strengths in the x-direction and y-direction are the same based on the same reason as explained for the aforementioned two-dimensional photonic crystal 15.

Another modification example of the two-dimensional photonic crystal 15 will be described with reference to FIG. 8.

Figure 8A:
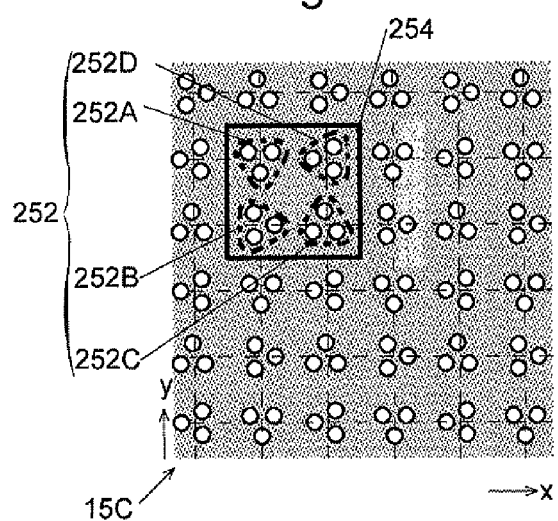
FIG. 8A and FIG. 8B are top views of a modification example of the two-dimensional photonic crystal in the two-dimensional photonic crystal laser of the present embodiment.

FIG. 8A shows a two-dimensional photonic crystal 15C in which cluster holes 252 are arranged in a square lattice pattern. In each cluster hole 252, three circular holes are arranged in an equilateral-triangular pattern. The cluster hole 252 has the same shape as the aforementioned cluster modified refractive index area 91B. In the "2×2" supercell 254, the cluster holes 252 are arranged at different angles as follows: with respect to the direction of the first cluster hole 252A the second cluster hole 252B, which is adjacent to the first cluster hole 252A in the y-direction, is oriented at 90'; the third cluster hole 252C, which is next-adjacent to the first cluster hole 252A at 45° to both x and y directions, is oriented at 180°; and the fourth cluster hole 252D, which is adjacent to the first cluster hole 252A in the x-direction, is oriented at 270°. Hence, although the shape of the modified refractive index areas (or holes) is different from that in the aforementioned two-dimensional photonic crystal 15, the directions of the modified refractive index areas are the same as in the two-dimensional photonic crystal 15. Consequently, in the two-dimensional photonic crystal laser which utilizes the two-dimensional photonic crystal 15C, the feedback strengths in the x-direction and y-direction are the same as in the case where the two-dimensional photonic crystal 15 is used, thereby symmetrical spots of laser light can be obtained in both x and y directions.

Figure 8B:
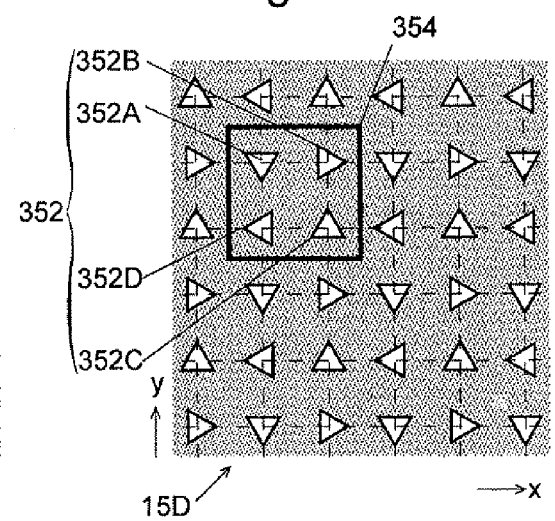

FIG. 8B shows a two-dimensional photonic crystal 15D in which equilateral-triangular holes 352 are arranged in a square lattice pattern. In the "2×2" supercell 354, the equilateral-triangular holes 352 are arranged at the following different angles with respect to the direction of the first equilateral-triangular hole 352A: 90°—the second equilateral-triangular hole 352B at the next lattice point clockwise; 180°—the third equilateral-triangular hole 352C; and 270°—the fourth equilateral-triangular hole 352D. The directions of these equilateral-triangular holes are the same as in the case of the aforementioned two-dimensional photonic crystal 15 and the two-dimensional photonic crystal 15C. Hence, the feedback strengths in the x-direction and y-direction are the same as in the case where the two-dimensional photonic crystal 15 is used, thereby symmetrical spots of laser light can be obtained in both x and y direction.

Also in the case where the cluster holes 252 or the equilateral-triangular holes 352 are used, the direction of each hole can be set to be the same as in the two-dimensional photonic crystal 15A or the two-dimensional photonic crystal 15B.

As another modification example of the two-dimensional photonic crystal 15, example of a two-dimensional photonic crystal in which holes are arranged in a triangular lattice pattern will be described with reference to FIG. 9.

Figure 9A:
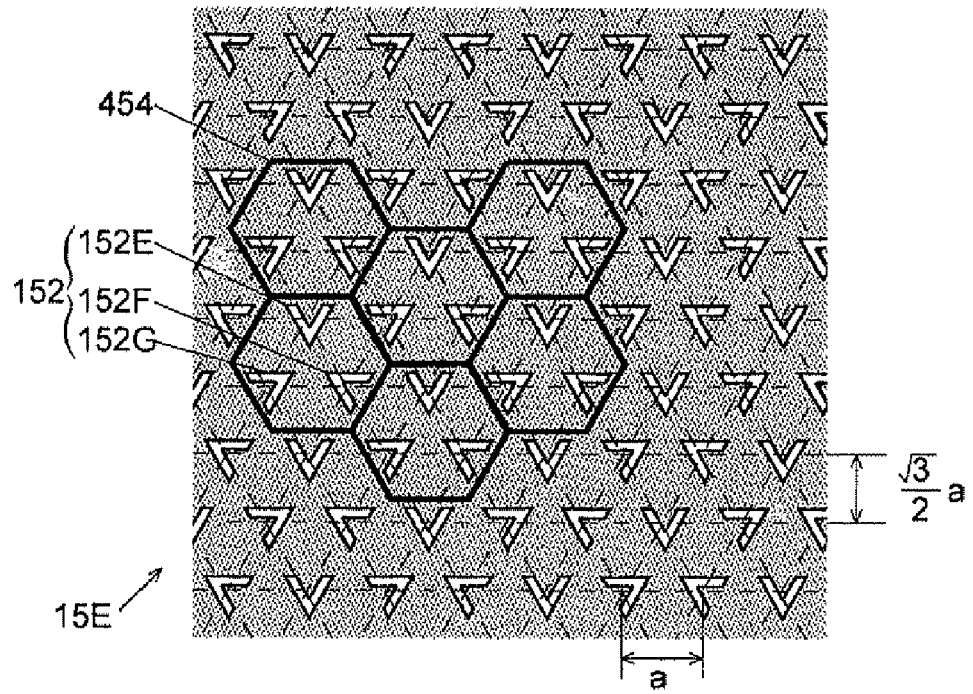
FIG. 9A and FIG. 9B are top views of a modification example of the two-dimensional photonic crystal in the two-dimensional photonic crystal laser of the present embodiment, in which holes are arranged in a triangular lattice pattern.

FIG. 9A is a top view of a two-dimensional photonic crystal 15E in which V-shaped holes 152 are arranged in a triangular lattice pattern (as indicated with the thin dashed lines in the figure) with a period a. In terms of the supercell 454 in which three V-shaped holes 152 are arranged as a unit in an equilateral-triangular pattern, the three V-shaped holes are oriented in different directions as follows: with respect to the direction of the first V-shaped hole 152E, the second V-shaped hole 152F at the apex neighboring the first apex in the clockwise direction is oriented at 120'; and the third V-shaped hole 152G is oriented at 240°.

In the two-dimensional photonic crystal laser which uses the two-dimensional photonic crystal 15E, standing waves having a wavelength of $(3^{0.5}/2)a$ corresponding to the intervals of the parallel lines within the triangular lattice are produced in three directions 120° apart from each other (i.e. the directions of the aforementioned reciprocal lattice vectors $b_1$, $b_2$, and $(b_2-b_1)$ or $(b_1+b_2)$). The V-shaped holes 152 are characterized in that, with respect to any of these three directions, one-third of all the V-shaped holes 152 included in the two-dimensional photonic crystal 15E point the direction of 0°, one-third point the direction of 120°, and the remaining one-third point the direction of 240°. Therefore, the permittivity distribution $\in(x, y)$ of formula (1) has a threefold rotational symmetry, which equalizes the feedback strengths in the three directions in which the standing wave is produced. As a result, symmetrical spots of laser light can be obtained independently of the direction.

Figure 9B:
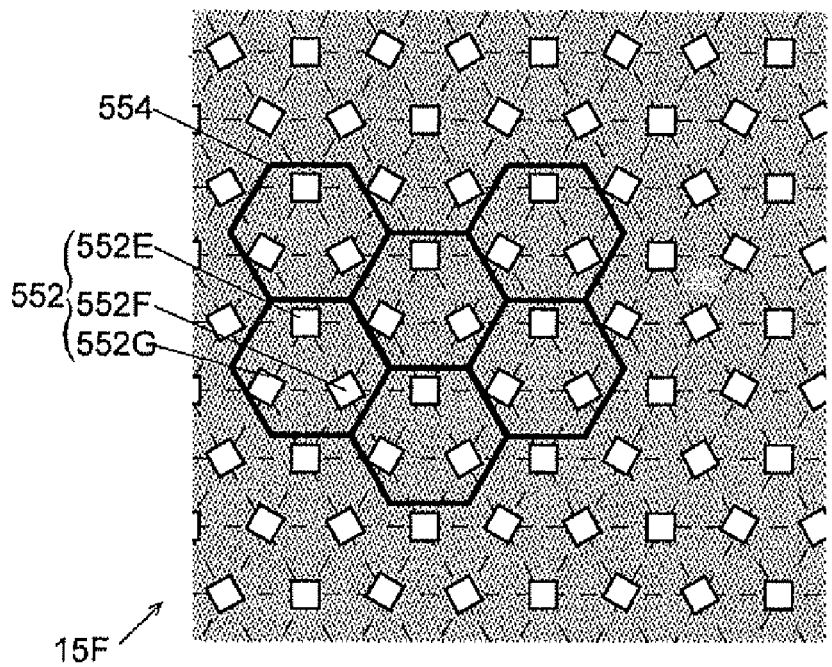

FIG. 9B is a top view of a two-dimensional photonic crystal 15F in which square holes 552 are arranged in a triangular lattice pattern with a period a. As in the case of the aforementioned two-dimensional photonic crystal 15E, the supercell 554 is considered in which three square holes 522 are arranged as a unit in an equilateral-triangular pattern. With respect to the direction of the first square hole 552E, the second square hole 552F at the next apex in the clockwise direction is oriented at 120° and the third square hold 552G is oriented at 240°. Accordingly, symmetrical spots of laser light can be obtained as with the two-dimensional photonic crystal 15E.

EXPLANATION OF NUMERALS

10 . . . Two-Dimensional Photonic Crystal Laser
11 . . . Upper Substrate
12 . . . First Cladding Layer
13 . . . Active Layer
14 . . . Spacer Layer
15, 15A, 15B, 15C, 15D, 15E, 15F . . . Two-Dimensional Photonic Crystal
151, 93 . . . Plate-Shaped Member
152 . . . V-Shaped Hole
152A, . . . 152E First V-Shaped Hole
152B, . . . 152F Second V-Shaped Hole
152C, . . . 152G Third V-Shaped Hole
152D . . . Fourth V-Shaped Hole
154, 154A, 154B, 254, 354, 454 . . . Supercell
16 . . . Second Cladding Layer
17 . . . Lower Substrate
18 . . . Upper Electrode
181 . . . Window
19 . . . Lower Electrode
252 . . . Cluster Hole
252A . . . First Cluster Hole
252B . . . Second Cluster Hole
252C . . . Third Cluster Hole
252D . . . Fourth Cluster Hole
352 . . . Equilateral-Triangular Hole
352A . . . First Equilateral-Triangular Hole
352 . . . Second Equilateral-Triangular Hole
352C . . . Third Equilateral-Triangular Hole
352D . . . Fourth Equilateral-Triangular Hole
552 . . . Square Hole
552E . . . First Square Hole
552F . . . Second Square Hole
552G . . . Third Square Hole
91A . . . V-Shaped Modified Refractive Index Area
91B . . . Cluster Modified Refractive Index Area
921 . . . First Half-Line
922 . . . Second Half-Line

The invention claimed is:

1. A two-dimensional photonic crystal laser, including:
   a two-dimensional photonic crystal made of a plate-shaped member provided with a periodic arrangement of many identically-shaped modified refractive index areas having a refractive index different from that of the plate-shaped member; and
   an active layer provided on one side of the two-dimensional photonic crystal, wherein:
   the modified refractive index areas are arranged at lattice points of a lattice with a same period at least in two directions;
   a shape of each modified refractive index area is such that a feedback strength is different with respect to directions of two primitive reciprocal lattice vectors of the lattice;
   the two-dimensional photonic crystal has a periodic structure of a supercell, as a unit, which contains a plurality of lattice points; and
   a sum of the feedback strengths by all modified refractive index areas in the supercell is identical in each direction of the two primitive reciprocal lattice vectors.

2. The two-dimensional photonic crystal laser according to claim 1, wherein the lattice is any one of a square lattice, a triangular lattice, and an orthorhombic lattice in which the two primitive reciprocal lattice vectors have a same magnitude.

3. The two-dimensional photonic crystal laser according to claim 2, wherein the lattice is a square lattice, and each of the modified refractive index areas is asymmetrical with respect to an axis at 45 degrees to the two directions in which the modified refractive index areas are arranged with the same period.

4. The two-dimensional photonic crystal laser according to claim 3, wherein:
   each of the supercells is composed of four lattice points as a unit, with two lattice points in a vertical direction and two lattice points in a horizontal direction; and
   in each of the supercells, with respect to a direction of one modified refractive index area, directions of other three modified refractive index areas are at 90, 180, and 270 degrees.

5. The two-dimensional photonic crystal laser according to claim 3, wherein:
   each of the supercells is composed of four lattice points as a unit, with two lattice points in a vertical direction and two lattice points in a horizontal direction; and
   in each of the supercells, with respect to a direction of a first modified refractive index area, a direction of a second modified refractive index area among other three modified refractive index areas is the same as the first modified refractive index area and directions of the other two modified refractive index areas are at 90 degrees to the first modified refractive index area.

6. The two-dimensional photonic crystal laser according to claim 2, wherein:
   the lattice is a triangular lattice;
   each of the supercells is composed of three adjacent lattice points arranged in an equilateral-triangular form as a unit; and in each of the supercells, with respect to a direction of one modified refractive index area, the other two modified refractive index areas are oriented at 120 and 240 degrees, respectively.

7. The two-dimensional photonic crystal laser according to claim 1, wherein, in each modified refractive index area, no part of the modified refractive index area lies on a gravity center thereof and on a first half-line extending from the gravity center in a direction within a plane of the two-dimensional photonic crystal, while at least a part of the modified refractive index area lies on a second half-line extending from the gravity center in a direction opposite to the first half-line.

8. The two-dimensional photonic crystal laser according to claim 7, wherein the modified refractive index area is V-shaped.

9. The two-dimensional photonic crystal laser according to claim 7, wherein the modified refractive index area is a triangular arrangement of three identically-shaped areas having a refractive index different from that of the body material.

10. The two-dimensional photonic crystal laser according to claim 1, wherein each of the supercells contains at least one modified refractive index area which is oriented differently from other modified refractive index areas in the supercell.

* * * * *